United States Patent
Strong et al.

(10) Patent No.: US 10,431,867 B1
(45) Date of Patent: Oct. 1, 2019

(54) CLOCK DISTRIBUTION SYSTEM

(71) Applicants: Joshua A. Strong, Ellicott City, MD (US); Max E. Nielsen, Odenton, MD (US); Peter John Andrews, Glen Burnie, MD (US)

(72) Inventors: Joshua A. Strong, Ellicott City, MD (US); Max E. Nielsen, Odenton, MD (US); Peter John Andrews, Glen Burnie, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/012,517

(22) Filed: Jun. 19, 2018

(51) Int. Cl.
*G06F 1/10* (2006.01)
*H01P 7/08* (2006.01)
*H03K 5/15* (2006.01)
*H01L 23/66* (2006.01)

(52) U.S. Cl.
CPC ............... *H01P 7/082* (2013.01); *G06F 1/10* (2013.01); *H01L 23/66* (2013.01); *H03K 5/15013* (2013.01); *H01L 2223/6616* (2013.01); *H01L 2223/6627* (2013.01)

(58) Field of Classification Search
None
See application file for complete search history.

(56) References Cited

U.S. PATENT DOCUMENTS

| | | | | | |
|---|---|---|---|---|---|
| 3,619,504 | A | * | 11/1971 | De Veer | G06F 13/4072 178/70 M |
| 5,365,205 | A | * | 11/1994 | Wong | G06F 13/4077 333/109 |
| 5,432,486 | A | * | 7/1995 | Wong | H01R 12/62 333/109 |

(Continued)

FOREIGN PATENT DOCUMENTS

WO 20160209387 A1 12/2016

OTHER PUBLICATIONS

International Written Opinion and Search Report corresponding to International Application No. PCT/US2018/058243 dated Jan. 30, 2019.

(Continued)

*Primary Examiner* — Jeffery S Zweizig
(74) *Attorney, Agent, or Firm* — Tarolli, Sundheim, Covell & Tummino LLP

(57) ABSTRACT

One embodiment includes a clock distribution system. The system includes a first resonator spine that propagates a first clock signal and a second resonator spine that propagates a second clock signal that is out-of-phase relative to the first clock signal. The system also includes at least one resonator rib each conductively coupled to at least one of the first and second resonator spines and being arranged as a standing wave resonator with respect to a respective at least one of the first and second clock signals to inductively provide the respective at least one of the first and second clock signals to an associated circuit via a respective transformer-coupling (Continued)

line. The system further includes an isolation element configured to mitigate at least one of inductive and capacitive coupling between the first and second clock signals.

27 Claims, 7 Drawing Sheets

(56) References Cited

U.S. PATENT DOCUMENTS

| | | | | |
|---|---|---|---|---|
| 5,638,402 | A | * | 6/1997 | Osaka ............... H04L 25/0266 375/219 |
| 5,990,721 | A | | 11/1999 | Mellitz |
| 6,563,358 | B1 | | 5/2003 | Goulette |
| 6,978,328 | B1 | * | 12/2005 | Osaka ............... H05K 1/0228 365/52 |
| 9,722,589 | B1 | | 8/2017 | Talanov et al. |

OTHER PUBLICATIONS

Japanese Office Action corresponding to Japanese Patent Application No. 2017-0562039 dated Dec. 25, 2018.

Korean Office Action for Application No. 10-2017-7037126 dated May 29, 2019.

Quentin P Herr Et al., "Ultra-Low-Power Superconductor Logic", arxiv.org, Cornell University Library, 201 Olin Library Cornell University Ithaca, NY 14853, Mar. 22, 2011, XP080545411, doi: 10.1063/1.3585849 the whole document.

International Search Report and Written Opinion PCT/US2019/018396 dated Apr. 25, 2019.

Chi V L., "Salphasic Distribution of Clock Signals for Synchronous Systems" IEEE Transactions on Computers, IEEE Service Center, vol. 43, No. 5, May 1, 1994.

* cited by examiner

CLOCK DISTRIBUTION SYSTEM

GOVERNMENT INTEREST

The invention was made under Government Contract Number W911NF-14-C-0116. Therefore, the US Government has rights to the invention as specified in that contract.

TECHNICAL FIELD

The present invention relates generally to computer systems, and specifically to a clock distribution system.

BACKGROUND

Typical circuits that implement logic functions can operate based on a clock to synchronize data and/or provide a time-based flow of the logic functions. Circuits that are based on complementary metal-oxide-semiconductor (CMOS) technology can implement a clock to indicate when a given logic circuit or gate is to capture data at one or more inputs for processing or transferring the data to other logic functions. A given clock can thus provide a clock signal to a variety of devices in the circuit to provide the requisite timing information, and thus to substantially synchronize data transfer and timing functions. Other types of circuits can implement clock signals, such as reciprocal quantum logic (RQL) circuits. RQL circuits can implement timing information based on a clock that is provided, for example, as a signal having a substantially stable-frequency.

SUMMARY

One embodiment includes a clock distribution system. The system includes a first resonator spine that propagates a first clock signal and a second resonator spine that propagates a second clock signal that is out-of-phase relative to the first clock signal. The system also includes at least one resonator rib each conductively coupled to at least one of the first and second resonator spines and being arranged as a standing wave resonator with respect to a respective at least one of the first and second clock signals to inductively provide the respective at least one of the first and second clock signals to an associated circuit via a respective transformer-coupling line. The system further includes an isolation element configured to mitigate at least one of inductive and capacitive coupling between the first and second clock signals.

Another example includes a clock distribution system. The system includes a first resonator spine that propagates an in-phase clock signal and a second resonator spine that propagates a quadrature clock signal. The system also includes a first resonator rib conductively coupled to the first resonator spine and being arranged as a standing wave resonator with respect to the in-phase clock signal to inductively provide the in-phase clock signal to an associated circuit via a first transformer-coupling line. The first resonator rib includes a portion that is conductively coupled to the first resonator spine. The system further includes a second resonator rib conductively coupled to the second resonator spine and being arranged as a standing wave resonator with respect to the quadrature phase clock signal to inductively provide the quadrature-phase clock signal to an associated circuit via a second transformer-coupling line. The second resonator rib includes a portion that is conductively coupled to the second resonator spine. The portion of the first resonator rib is arranged proximal and in parallel with the second resonator rib to mitigate at least one of inductive and capacitive coupling between the in-phase and quadrature phase clock signals.

Another example includes a clock distribution system. The system includes a first resonator spine that propagates an in-phase clock signal and a second resonator spine that propagates a quadrature clock signal. The system further includes at least one resonator rib each conductively coupled to at least one of the first and second resonator spines and being arranged as a standing wave resonator with respect to a respective at least one of the first and second clock signals to inductively provide the respective at least one of the first and second clock signals to an associated circuit via a respective transformer-coupling line. The first and second resonator spines can be arranged proximal and in parallel with each other. The at least one resonator rib conductively coupled to one of the first and second resonator spines extends from the one of the first and second resonator spines approximately orthogonally and crosses over or under the other of the first and second resonator spines.

DETAILED DESCRIPTION

Figure 1:
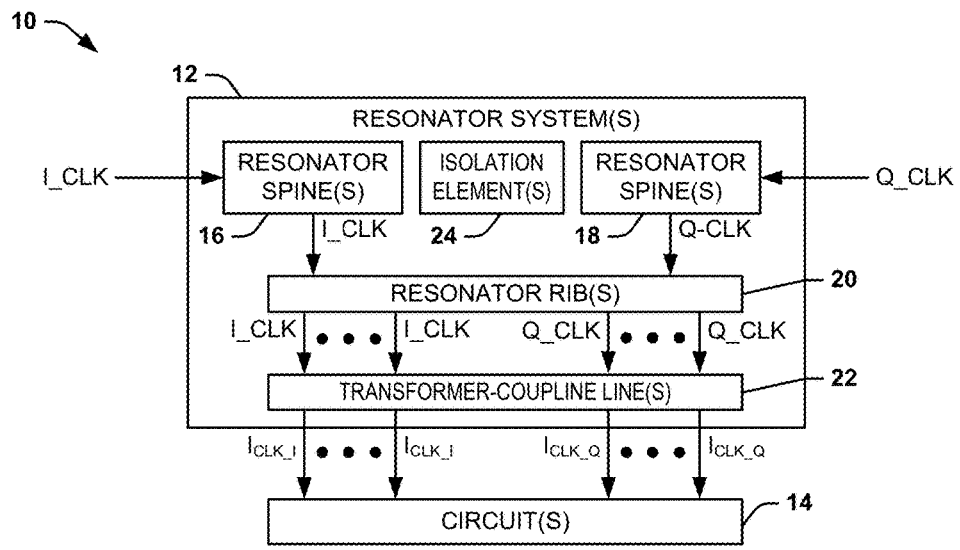
FIG. 1 illustrates an example of a clock distribution system.

The present invention relates generally to computer systems, and specifically to a clock distribution system. The clock distribution system, as described herein, includes a resonator system that is arranged as a resonator "spine" and "rib" configuration. As described herein, the term "spine", as pertaining to the resonator, describes a conductor that is configured to propagate a clock signal (e.g., a sinusoidal clock signal). The term "rib", as pertaining to the resonator, describes a conductor that is conductively coupled to the spine and is arranged as a standing-wave resonator that propagates the clock signal. The clock distribution system can include at least two resonator spines that are each configured to propagate separate AC clock signals, such as having a variable phase with respect to each other. For example, the clock distribution system can include a first resonator spine that can provide a first clock signal (e.g., an in-phase clock signal) and a second resonator spine that can provide a second clock signal (e.g., a quadrature-phase clock signal). The clock distribution system can include a plurality of resonator ribs that are each conductively coupled to the same resonator spine, and thus can each separately propagate the clock signal from the resonator spine. The resonator ribs and spines can have a defined thickness that may be variable, as described in greater detail herein. As described herein, the term "thickness", as pertaining to the resonator rib(s) and resonator spine(s), describes at least one dimension (e.g., width) of a cross-section of the respective resonator rib or spine.

In addition, the clock distribution system includes at least one transformer-coupling line that is conductively coupled to an associated circuit. The transformer-coupling line(s) are inductively coupled to the resonator rib(s) via a plurality of inductive couplings to inductively generate a clock current corresponding to the clock signal to provide functions for the associated circuit. As described herein, there a multitude of different configurations of the resonator rib and spine, and thus a multitude of different ways to provide the inductive couplings of the transformer-coupling line(s) to the resonator rib(s).

The clock distribution system can also include one or more isolation elements that are configured to mitigate inductive and/or capacitive coupling between the first and second clock signals. For example, the isolation element(s) can be configured as portions of the resonator ribs that are arranged in a specific manner to mitigate coupling between the respective clock signals. As another example, the isolation element(s) can be configured as positional relationships between the resonator ribs with respect to each other and with respect to conductive cross-bars that interconnect the resonator spines and the resonator ribs. As yet another example, the isolation element(s) can include additional conductors arranged near the resonator ribs and/or spines, such as grounded or DC cross-bars, a ground plane in an associated integrated circuit (IC) chip, and/or grounded via-wall structures. As yet another example, the isolation element(s) can include respective arrangements of crossover between resonator spines and ribs and/or resonator ribs with each other. Therefore, it is to be understood that, as described herein, the isolation element(s) are not limited to dedicated physical device(s), but can include or can instead be arrangements of the devices of the respective resonator system.

FIG. 1 illustrates an example of a clock distribution system 10. The clock distribution system 10 can be implemented in a variety of applications, such as in a reciprocal quantum logic (RQL) circuit design. For example, the clock distribution system 10 can be implemented in or as part of an integrated circuit (IC) chip.

The clock distribution system 10 includes at least one resonator system 12. The resonator system(s) 12 can be configured to provide clock signals to each of a respective one or more circuits 14 that may be distributed across an IC chip in which the clock distribution system 10 is implemented, as described herein. As an example, the clock signals can be provided as two out-of-phase clock signals. For example, in the example of FIG. 1, the clock signals are demonstrated as a quadrature signal (e.g., sinusoidal) including an in-phase clock signal I_CLK and a quadrature-phase clock signal Q_CLK that are 90° out-of-phase with respect to each other. In the example of FIG. 1, each of the resonator system(s) 12 includes at least one first resonator spine 16, at least one second resonator spine 18, and at least one resonator rib 20. The resonator rib(s) 20 are each conductively coupled to at least one of the respective resonator spine(s) 16 and 18. Thus, the clock signals I_CLK and Q_CLK, provided to the respective resonator spine(s) 16 and 18 (e.g., from local oscillator(s)), can be provided to propagate on each of the respective resonator rib(s) 20. As an example, the clock distribution system 10 can be arranged in a variety of different ways to distribute the clock signals I_CLK and Q_CLK to the circuits 14, such as described in patent application Ser. No. 15/816,518, filed 17 Nov. 2017, that is incorporated herein in its entirety by reference. Therefore, the clock distribution system 10 can correspond to any of a variety of the different clock distribution architectures described in the aforementioned Patent Application.

In the example of FIG. 1, the resonator system 12 also includes at least one transformer-coupling line 22. Each of the transformer-coupling line(s) 22 can be inductively coupled to one or more of the resonator rib(s) 20 to inductively provide one of corresponding clock currents $T_{CLK\_1}$ and $T_{CLK\_Q}$ to an associated one of the circuit(s) 14. Particularly, the transformer-coupling line(s) 22 are inductively coupled to the respective resonator rib(s) 20 via a plurality of inductive couplings to inductively generate the clock currents $T_{CLK\_1}$ and $T_{CLK\_Q}$ corresponding to the respective clock signals I_CLK and Q_CLK to provide functions (e.g., timing functions and/or power distribution functions) for the associated circuit(s) 14. As described herein, there can be a multitude of different configurations of the resonator rib(s) 20 and spine(s) 16, and thus a multitude of different ways to provide the inductive couplings of the transformer-coupling line(s) 22 to the resonator rib(s) 20.

In addition, in the example of FIG. 1, each of the resonator system(s) 12 includes one or more isolation elements 24. The isolation element(s) 24 are configured to mitigate inductive and/or capacitive coupling between the clock signals I_CLK and Q_CLK in the respective resonator system(s) 12. For example, the isolation element(s) 24 can be configured as portions of the resonator rib(s) 20 that are arranged in a specific manner to mitigate coupling between the respective clock signals I_CLK and Q_CLK. As another example, the isolation element(s) 24 can be configured as positional relationships between the resonator rib(s) 20 with respect to each other and with respect to conductive cross-bars that interconnect the resonator spines 16 and 18 and the resonator rib(s) 20. As yet another example, the isolation element(s) 24 can include additional conductors arranged near the resonator rib(s) 20 and/or spines 16 and 18, such as grounded or DC cross-bars, a ground plane in an associated integrated circuit (IC) chip, and/or grounded via-wall structures. As yet another example, the isolation element(s) 24 can include respective arrangements of crossover between resonator rib(s) 20 and/or spines 16 and 18 and/or resonator rib(s) 20 with each other. Therefore, it is to be understood that, as described herein, the isolation element(s) 24 are not limited to dedicated physical device(s), but can include or can instead be arrangements of the devices of the respective resonator system(s) 12, and can be different from one resonator system 12 to another resonator system 12.

Figure 2:
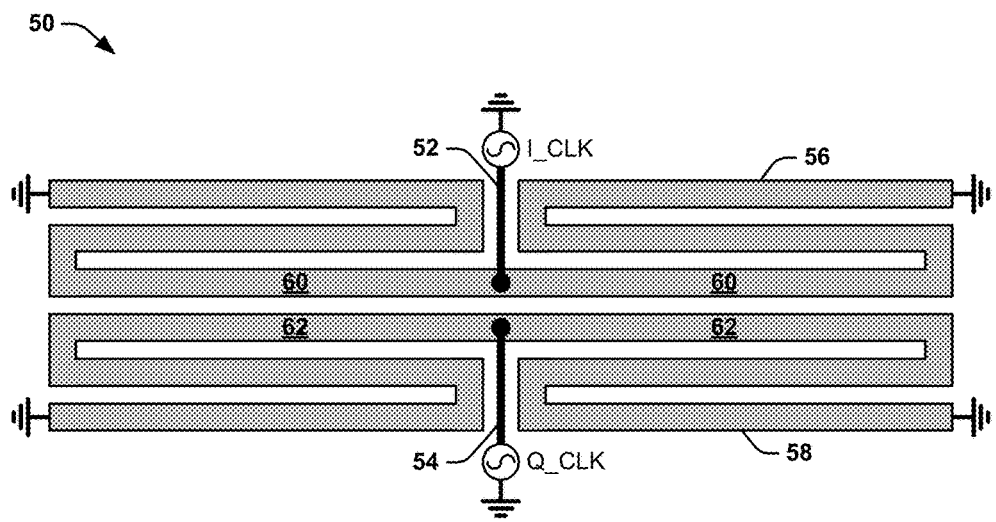
FIG. 2 illustrates an example of a resonator system.

FIG. 2 illustrates an example of a resonator system 50. The resonator system 50 can correspond to one of the resonator system(s) 12 in the example of FIG. 1. Therefore, reference is to be made to the example of FIG. 1 in the following description of the example of FIG. 2.

In the example of FIG. 2, the resonator system 50 includes a first resonator spine 52 and a second resonator spine 54. In the example of FIG. 2, the first resonator spine 52 propagates a first clock signal, demonstrated in the example of FIG. 2 as an in-phase clock signal I_CLK, and the second resonator spine 54 propagates a second clock signal, demonstrated in the example of FIG. 2 as a quadrature-phase clock signal Q_CLK. The resonator system 50 also includes a first resonator rib 56 that is conductively coupled to the first resonator spine 52 and a second resonator rib 58 that is conductively coupled to the second resonator spine 54. In the example of FIG. 2, each of the first and second resonator ribs 56 and 58 includes a plurality of bends to provide a plurality of parallel portions of the respective first and second resonator ribs 56 and 58. The first resonator spine 52 is conductively coupled to an approximate midpoint of a portion 60 of the first resonator rib 56, and the second resonator spine 54 is conductively coupled to an approximate midpoint of a portion 62 of the second resonator rib 58. The portions 60 and 62 are arranged proximal and in parallel with each other.

The arrangement of the portions 60 and 62 can be such that mutual inductive coupling of the clock signals I_CLK and Q_CLK is substantially mitigated. For example, as described in patent application Ser. No. 15/816,518, current in the respective resonator ribs 56 and 58 that is provided from the respective clock signals I_CLK and Q_CLK has an amplitude that is at a minimum at the coupling to the respective resonator spines 52 and 54, with the amplitude increasing toward the respective grounded ends of the respective resonator ribs 56 and 58. Therefore, based on the substantially minimal current amplitude associated with the clock signals I_CLK and Q_CLK in the respective portions 60 and 62, the mutual inductance between the clock signals I_CLK and Q_CLK can be substantially mitigated, despite a potential necessity of arranging the resonator ribs 56 and 58 to be proximal with respect to each other.

As an example, for purposes spatial considerations and/or providing different phase relationships of the induced currents $T_{CLK\_I}$ and $T_{CLK\_Q}$, the resonator ribs 56 and 58 may be required to have some proximity to each other. However, based on the remaining parallel portions having increased amplitude of the respective currents associated with the clock signals I_CLK and Q_CLK, the remaining parallel portions are arranged to be more distally located with respect to each other, while the more proximal portions 60 and 62 to which the respective resonator spines 52 and 54 are coupled carry the least current amplitude. Accordingly, a mutual inductive coupling between the clock signals I_CLK and Q_CLK can be mitigated based on the arrangement of the resonator ribs 56 and 58 provided in the resonator system 50. As a result, in the example of FIG. 2, the portions 60 and 62 can correspond to the isolation element(s) 24 in the example of FIG. 1.

Figure 3:
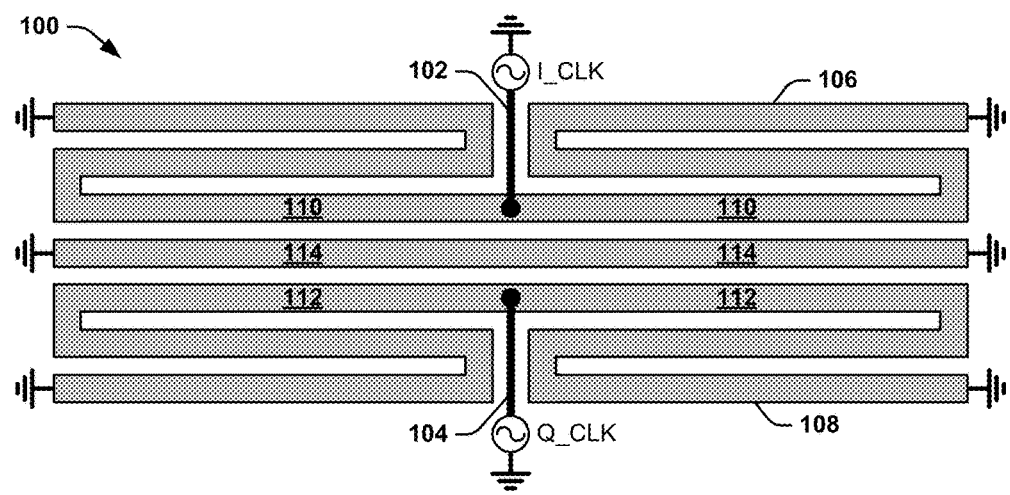
FIG. 3 illustrates another example of a resonator system.

FIG. 3 illustrates an example of a resonator system 100. The resonator system 100 can correspond to one of the resonator system(s) 12 in the example of FIG. 1. Therefore, reference is to be made to the example of FIG. 1 in the following description of the example of FIG. 3.

In the example of FIG. 3, the resonator system 100 includes a first resonator spine 102 and a second resonator spine 104. In the example of FIG. 3, the first resonator spine 102 propagates a first clock signal, demonstrated in the example of FIG. 3 as an in-phase clock signal I_CLK, and the second resonator spine 104 propagates a second clock signal, demonstrated in the example of FIG. 3 as a quadrature-phase clock signal Q_CLK. The resonator system 100 also includes a first resonator rib 106 that is conductively coupled to the first resonator spine 102 and a second resonator rib 108 that is conductively coupled to the second resonator spine 104. In the example of FIG. 3, each of the first and second resonator ribs 106 and 108 includes a plurality of bends to provide a plurality of parallel portions of the respective first and second resonator ribs 106 and 108. The first resonator spine 102 is conductively coupled to an approximate midpoint of a portion 110 of the first resonator rib 106, and the second resonator spine 104 is conductively coupled to an approximate midpoint of a portion 112 of the second resonator rib 108. The portions 110 and 112 are arranged proximal and in parallel with each other.

In addition, the resonator system 100 includes a grounded cross-bar conductor 114 that extends between and in parallel with each of the portions 110 and 112 of the respective first and second resonator ribs 106 and 108. The grounded cross-bar conductor 114 can correspond to a conductor that extends along the length of the portions 110 and 112, and can extend along and be part of other resonator systems 100. For example, the grounded cross-bar conductor 114 can have a length that is approximately equal to the length of the portions 110 and 112, as demonstrated in the example of FIG. 3, or can have a length that extends longer and extends between and in parallel with portions of respective first and second resonator ribs of one or more additional resonator systems. The grounded cross-bar conductor 114 is demonstrated in the example of FIG. 3 as being grounded on both ends, but it is to be understood that the grounding of the grounded cross-bar conductor 114 can be provided in any of a variety of ways that both provide grounding of the respective conductor and facilitate current-carrying capability (e.g., via inductive coupling). As an example, substantially the entirety of the grounded cross-bar conductor 114 can be coupled to a grounded connection (e.g., a ground plane or ground-wall vias), such as by being substantially contiguously coupled to a grounded connection.

The arrangement of the portions 110 and 112 and the grounded cross-bar conductor 114 can be such that mutual inductive coupling of the clock signals I_CLK and Q_CLK is substantially mitigated. Similar to as described in the example of FIG. 2, current in the respective resonator ribs 106 and 108 that is provided from the respective clock signals I_CLK and Q_CLK has an amplitude that is at a minimum at the coupling to the respective resonator spines 102 and 104, with the amplitude increasing toward the respective grounded ends of the respective resonator ribs 106 and 108. However, the grounded cross-bar conductor 114 can provide an additional inductive shield between the portions 110 and 112. For example, the proximity of the grounded cross-bar conductor 114 can facilitate inductive coupling between the grounded cross-bar conductor 114 and each of the respective portions 110 and 112. As a result, the inductive coupling between the clock signals I_CLK and Q_CLK in the respective portions 110 and 112 is mitigated further relative to the resonator system 50 in the example of FIG. 2. Accordingly, a mutual inductive coupling between the clock signals I_CLK and Q_CLK can be mitigated based on the arrangement of the resonator ribs 106 and 108 on opposing sides of the grounded cross-bar conductor 114 provided in the resonator system 100. As a result, in the example of FIG. 3, the portions 110 and 112 and the grounded cross-bar conductor 114 can correspond to the isolation element(s) 24 in the example of FIG. 1.

Figure 4:
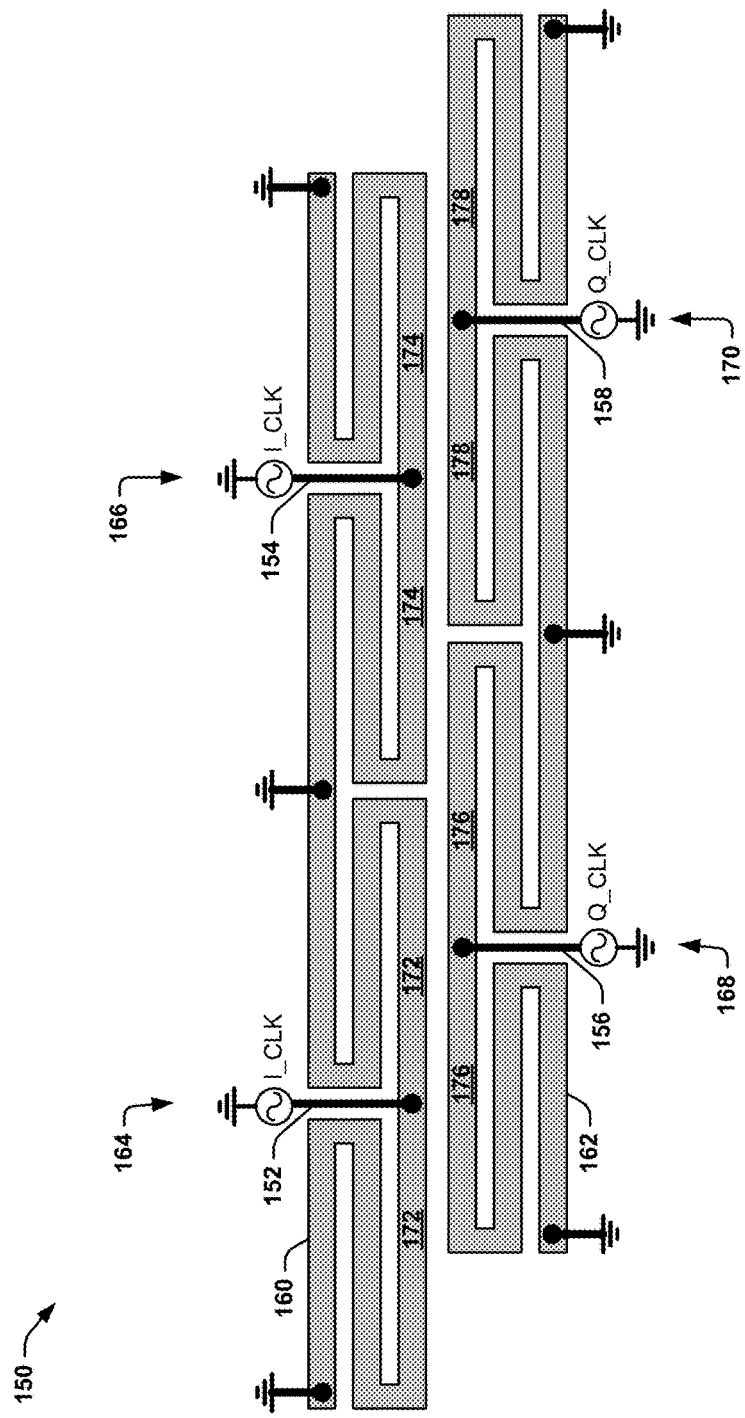
FIG. 4 illustrates another example of a resonator system.

FIG. 4 illustrates an example of a resonator system 150. The resonator system 150 can correspond to one of the resonator system(s) 12 in the example of FIG. 1. Therefore, reference is to be made to the example of FIG. 1 in the following description of the example of FIG. 4.

In the example of FIG. 4, the resonator system 150 includes a first resonator spine 152, a second resonator spine 154, a third resonator spine 156, and a fourth resonator spine 158. In the example of FIG. 4, the first and second resonator spines 152 and 154 each propagate a first clock signal, demonstrated in the example of FIG. 4 as an in-phase clock signal I_CLK, and the third and fourth resonator spines 156 and 158 each propagate a second clock signal, demonstrated in the example of FIG. 4 as a quadrature-phase clock signal Q_CLK. As an example, the first and second resonator spines 152 and 154 can each be conductively coupled and the third and fourth resonator spines 156 and 158 can each be conductively coupled. As another example, the first and second resonator spines 152 and 154 can provide separate phase-locked first clock signals (e.g., from separate clock sources), and the third and fourth resonator spines 156 and 158 can provide separate phase-locked second clock signals (e.g., from separate clock sources).

The resonator system 150 also includes a first resonator rib 160 that is conductively coupled to the first and second resonator spines 152 and 154 and a second resonator rib 162 that is conductively coupled to the third and fourth resonator spines 156 and 158. In the example of FIG. 4, each of the first and second resonator ribs 160 and 162 includes a plurality of bends to provide a plurality of parallel portions of the respective first and second resonator ribs 160 and 162. In the example of FIG. 4, each of the first and second resonator ribs 160 and 162 is arranged as equivalent to two contiguous resonator ribs 56 and 58, respectively, in the example of FIG. 2. Particularly, in the example of FIG. 4, the resonator rib 160 includes a first section 164 and a second section 166 that are approximately equal and symmetrical about a ground connection between the first and second sections 164 and 166, and the resonator rib 162 includes a first section 168 and a second section 170 that are approximately equal and symmetrical about a ground connection between the first and second sections 168 and 170.

While the example of FIG. 4 demonstrates two sections for each of the resonator ribs 160 and 162, it is to be understood that the resonator ribs 160 and 162 could include more sections, and are not limited to having an equal number of sections.

Additionally, similar to as described in the example of FIG. 2, the first resonator spine 152 is conductively coupled to an approximate midpoint of a first portion 172 of the first resonator rib 160 and the second resonator spine 154 is conductively coupled to an approximate midpoint of a second portion 174 of the first resonator rib 160. Similarly, the third resonator spine 156 is conductively coupled to an approximate midpoint of a first portion 176 of the second resonator rib 162 and the fourth resonator spine 158 is conductively coupled to an approximate midpoint of a second portion 178 of the second resonator rib 162. The portions 172 and 174 of the first resonator rib 160 are arranged proximal and in parallel with the portions 176 and 178 of the second resonator rib 162.

However, as opposed to the example of FIG. 2, the resonator ribs 160 and 162 are arranged asymmetrically along the length of the portions 172 and 174 and the portions 176 and 178, respectively, of the resonator ribs 160 and 162 with respect to the coupling of the first resonator rib 160 to the resonator spines 152 and 154 and with respect to the coupling of the resonator rib 162 to the resonator spine 156 and 158. Particularly, the resonator ribs 160 and 162 are asymmetrical with respect to each other about a spacing between them, demonstrated by dotted line 180, and are thus demonstrated as staggered relative to each other, as opposed to being arranged symmetrically as demonstrated in the example of FIG. 2. In the example of FIG. 4, the first and second resonator ribs 160 and 162 are staggered by approximately one-fourth a length of a given one of the portions 172, 174, 176, and 178. However, other staggering arrangements are possible (e.g., one half a length of a given one of the portions 172, 174, 176, and 178).

The arrangement of the portions 172, 174, 176, and 178 can be such that mutual inductive coupling of the clock signals I_CLK and Q_CLK is substantially mitigated. For example, as described in patent application Ser. No. 15/816,518, current in the respective resonator ribs 160 and 162 that is provided from the respective clock signals I_CLK and Q_CLK has an amplitude that is at a minimum at the coupling to the respective resonator spines 152, 154, 156, and 158 with the amplitude increasing toward the respective grounded portions of the respective resonator ribs 160 and 162. Therefore, the current amplitude in a given one of the portions 172, 174, 176, and 178 is greatest most proximal to the bends. By staggering the resonator ribs 160 and 162, the greatest current amplitudes of the portions 172 and 174 are not proximal with respect to the greatest current amplitudes of the portions 176 and 178. Accordingly, the mutual inductance between the clock signals I_CLK and Q_CLK can be substantially mitigated based on the arrangement of the resonator ribs 160 and 162 provided in the resonator system 150. As a result, in the example of FIG. 4, the portions 160 and 162 can correspond to the isolation element(s) 24 in the example of FIG. 1. It is also to be understood that the resonator system 150 in the example of FIG. 4 could likewise include a grounded cross-bar conductor, similar to as described in the example of FIG. 3, to further mitigate mutual inductive coupling of the clock signals I_CLK and Q_CLK.

Figure 5:
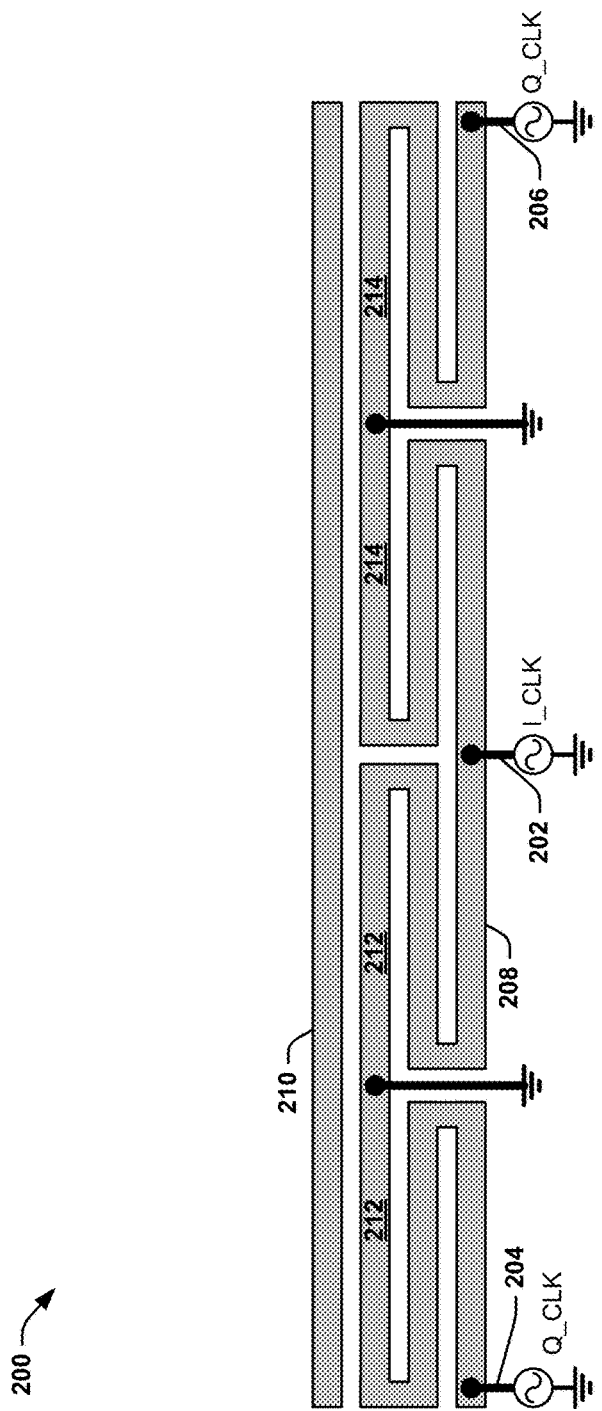
FIG. 5 illustrates another example of a resonator system.

FIG. 5 illustrates an example of a resonator system 200. The resonator system 200 can correspond to one of the resonator system(s) 12 in the example of FIG. 1. Therefore, reference is to be made to the example of FIG. 1 in the following description of the example of FIG. 5.

In the example of FIG. 5, the resonator system 200 includes a first resonator spine 202, a second resonator spine 204, and a third resonator spine 206. In the example of FIG. 5, the first resonator spine 202 propagates a first clock signal, demonstrated in the example of FIG. 5 as an in-phase clock signal I_CLK, and the second and third resonator spines 204 and 206 each propagate a second clock signal, demonstrated in the example of FIG. 5 as a quadrature-phase clock signal Q_CLK. As an example, the second and third resonator spines 204 and 206 can each be conductively coupled, or can provide separate phase-locked first clock signals (e.g., from separate clock sources).

The resonator system 200 also includes a resonator rib 208 that is conductively coupled to each of the resonator spines 202, 204, and 206. The resonator rib 208 includes a plurality of bends to provide a plurality of parallel portions. The first resonator spine 202 is demonstrated in the example of FIG. 5 as coupled to an approximate center or mid-point along the length of the resonator rib 208, and each of the second and third resonator spines 204 and 206 are coupled to respective opposite ends of the resonator rib 208. Additionally, ground connections are coupled to the resonator rib 208 at locations that are approximately equidistant between the conductive couplings of the first resonator spine 202 to the respective second and third resonator spines 204 and 206. Therefore, based on the arrangement of the resonator spines 202, 204, and 206 with respect to the coupling to the resonator rib 208, the clock signal I_CLK propagates from the resonator spine 202 along the resonator rib 208 to each of the ground connections, and the clock signal Q_CLK propagates from the resonator spines 204 and 206 along the resonator rib 208 to the respective ground connections.

In addition, the resonator system 200 includes a DC cross-bar conductor 210 arranged proximal to and parallel with respective portions 212 and 214 of the resonator rib 208. The DC cross-bar conductor 210 can be configured to propagate a DC current IDC along a length of the DC cross-bar conductor 210. As a result, based on the arrangement of the resonator spines 202, 204, and 206 with respect to the coupling to the resonator rib 208, and based on the inductive coupling of the current associated with the clock signals I_CLK and Q_CLK in the portions 212 and 210, the mutual inductance between the clock signals I_CLK and Q_CLK can be substantially mitigated. As a result, in the example of FIG. 5, the portions 212 and 214, as well as the DC cross-bar conductor 210, can correspond to the isolation element(s) 24 in the example of FIG. 1. It is also to be understood that the resonator system 200 in the example of FIG. 5 could likewise include another resonator rib arranged opposite the DC cross-bar conductor 210 that is configured substantially similar to the resonator rib 208, such as with the resonator spines being reversed (e.g., the clock signal I_CLK being provided at the ends of the additional resonator rib and the clock signal Q_CLK being provided at the approximate midpoint of the additional resonator rib).

The discussion of mitigating coupling between the clock signals I_CLK and Q_CLK has been described thus far with respect to mitigating mutual inductive coupling between the clock signals I_CLK and Q_CLK. However, other types of coupling, such as capacitive coupling, can likewise be mitigated with the techniques described herein. As an example, capacitive coupling can arise from crossovers of conductors that carry the respective clock signals I_CLK and Q_CLK. As described herein, a "crossover" describes when a conductor (e.g., a resonator rib or resonator spine) crosses over or under another conductor (e.g., a resonator rib or resonator spine), such as approximately orthogonally, with the two conductors carrying the first and second clock signals I_CLK and Q_CLK, respectively.

Figure 6:
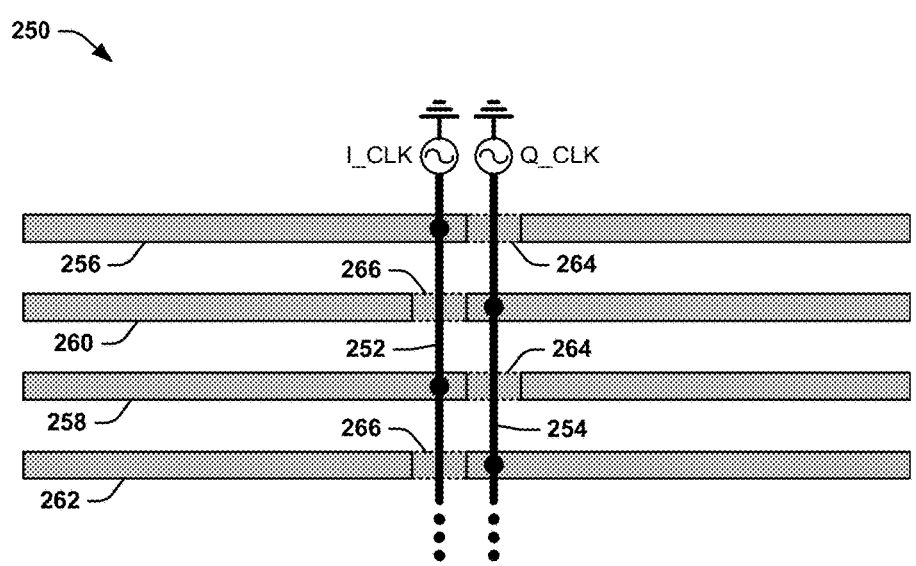
FIG. 6 illustrates another example of a resonator system.

FIG. 6 illustrates an example of a resonator system 250. The resonator system 250 can correspond to one of the resonator system(s) 12 in the example of FIG. 1. Therefore, reference is to be made to the example of FIG. 1 in the following description of the example of FIG. 6.

In the example of FIG. 6, the resonator system 250 includes a first resonator spine 252 and a second resonator spine 254. In the example of FIG. 6, the first resonator spine 252 propagates a first clock signal, demonstrated in the example of FIG. 6 as an in-phase clock signal I_CLK, and the second resonator spine 254 propagates a second clock signal, demonstrated in the example of FIG. 6 as a quadrature-phase clock signal Q_CLK. In the example of FIG. 6, the resonator spines 252 and 254 are arranged proximal to and in parallel with each other. The resonator system 250 also includes a first resonator rib 256 and a second resonator rib 258 that are each conductively coupled to the first resonator spine 252, and a third resonator rib 260 and a fourth resonator rib 262 that are each conductively coupled to the second resonator spine 254.

To distribute the first and second clock signals I_CLK and Q_CLK, respectively, to various parts of the circuit, such as in an IC chip, the resonator ribs 256, 258, 260, and 262 can extend in both directions orthogonally from the respective resonator spines 252 and 254. As a result, in the example of FIG. 6, the first and second resonator ribs 256 and 258 are demonstrated as passing under the second resonator spine 254, demonstrated at crossovers 264, and the third and fourth resonator ribs 260 and 262 are demonstrated as passing under the first resonator spine 252, demonstrated at crossovers 266. While the example of FIG. 6 demonstrates that the resonator ribs 256, 258, 260, and 262 pass under (e.g., behind) the respective resonator spines 252 and 254, it is to be understood that one or more of the resonator ribs 256, 258, 260, and 262 can pass over (e.g., in front of) the respective resonator spines 252 and 254.

At each of the crossovers 264 and 266, the clock signals I_CLK and Q_CLK can be capacitively coupled with respect to each other. Such capacitive coupling can result in errors in the respective clock signals I_CLK and Q_CLK. Therefore, the following examples can be implemented to mitigate the capacitive coupling between the clock signals I_CLK and Q_CLK, as described in greater detail herein.

Figure 7:
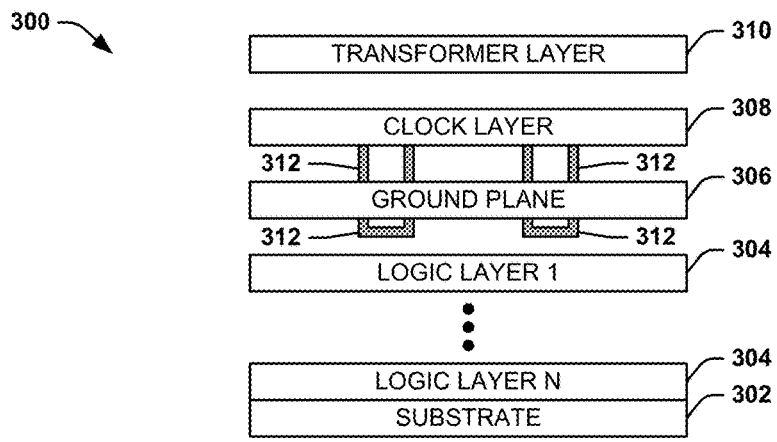
FIG. 7 illustrates an example of an integrated circuit (IC) chip.

FIG. 7 illustrates an example of an integrated circuit (IC) chip 300. The IC chip 300 can correspond to any of a variety of IC chips that are fabricated to include classical or quantum computing components. Any of the examples described herein can be implemented on an IC chip, such as the IC chip 300 described in the example of FIG. 7. Therefore, the resonator system 10 in the example of FIG. 1 can be fabricated as or as part of the IC chip 300. The IC chip 300 is demonstrated diagrammatically as a profile view that demonstrates a plurality of layers of the IC chip 300. The layers of the IC chip 300 are demonstrated as not necessarily being to scale, and the layers are demonstrated as spatially staggered in an exaggerated manner for ease in description.

The IC chip 300 includes a substrate 302 on which the additional layers are fabricated, and includes a plurality N of logic layers 304, where N is a positive integer. The logic layers 304 can include any of a variety of layers that include interconnecting signal-carrying conductors and digital or quantum gates. The IC chip 302 also includes a ground plane 306, a clock layer 308, and a transformer layer 310. As an example, the ground plane 306 can correspond to a grounded conductor that is interposed between the logic layers 304 and the clock layer 308, and can include vias and/or via-walls that can extend up or down into the clock layer 308 and/or the logic layers 304 to provide ground connections. The clock layer 308 can include the resonator systems described herein, including the resonator ribs and spines. The transformer layer 310 can include conductors that are inductively coupled to the resonator ribs, similar to as described in patent application Ser. No. 15/816,518, and to which the associated circuits that receive the clock currents are coupled.

In the example of FIG. 7, the IC chip 300 includes crossover connections 312 that extend from the clock layer 308 and through the ground plane 306, extend laterally along the opposite side of the ground plane 306 relative to the clock layer 308, and then back through the ground plane 306 to the clock layer 308. The crossover connections 312 can thus correspond to portions of a resonator spine or resonator rib that crosses over (or under) another resonator rib or resonator spine. Therefore, the crossover connections 312 can correspond to the crossovers 264 and/or 266 in the example of FIG. 6. Because the crossover connections 312 extend below the ground plane 306 relative to the clock layer 308, the ground plane 306 can provide isolation of the one of the first and second clock signals propagating on the crossover connection 312 relative to the other of the first and second clock signals propagating on the conductor in the clock layer 308 that is bypassed (crossed-over) by the respective crossover connection 312. Accordingly, based on the isolation provided by the ground plane 306, the arrangement of the crossover connections 312 and the ground plane 306 can mitigate capacitive coupling between the clock signals I_CLK and Q_CLK. As a result, in the example of FIG. 7, the crossover connections 312 and the ground plane 306 can correspond to the isolation element(s) 24 in the example of FIG. 1.

Figure 8:
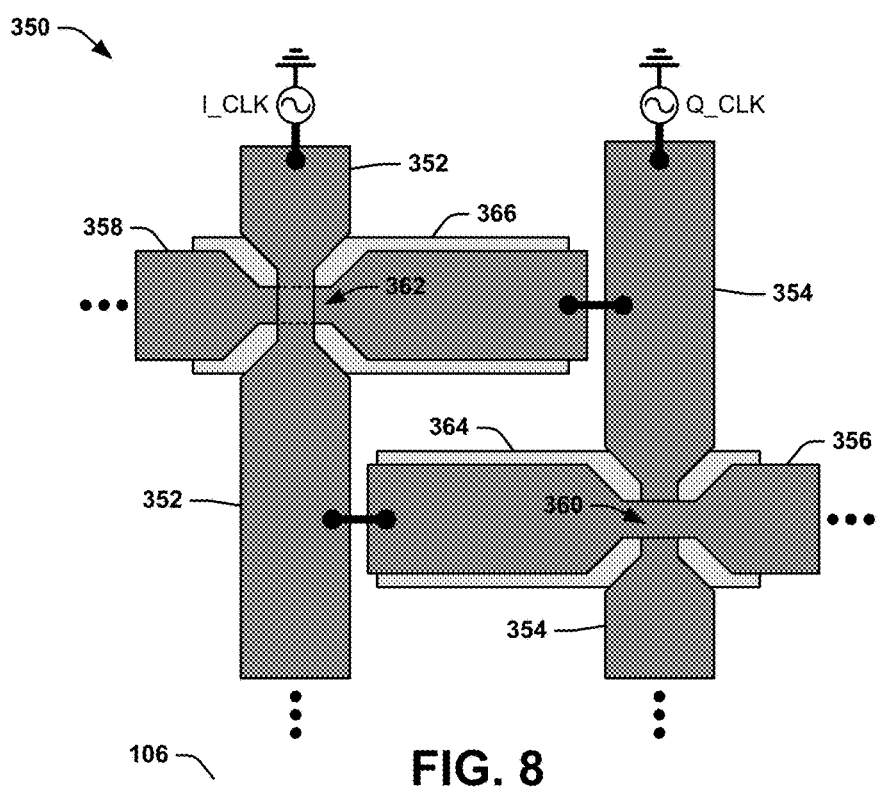
FIG. 8 illustrates another example of a resonator system.

FIG. 8 illustrates an example of a resonator system 350. The resonator system 350 can correspond to one of the resonator system(s) 12 in the example of FIG. 1. Therefore, reference is to be made to the example of FIG. 1 in the following description of the example of FIG. 8.

In the example of FIG. 8, the resonator system 350 includes a first resonator spine 352 and a second resonator spine 354. In the example of FIG. 8, the first resonator spine 352 propagates a first clock signal, demonstrated in the example of FIG. 8 as an in-phase clock signal I_CLK, and the second resonator spine 354 propagates a second clock signal, demonstrated in the example of FIG. 8 as a quadrature-phase clock signal Q_CLK. In the example of FIG. 8, the resonator spines 352 and 354 are arranged proximal to and in parallel with each other. The resonator system 350 also includes a first resonator rib 356 that is conductively coupled to the first resonator spine 352, and a second resonator rib 358 that is conductively coupled to the second resonator spine 354. In the example of FIG. 8, the resonator spines 352 and 354 and the resonator ribs 356 and 358 are demonstrated as having a thickness that is exaggerated relative to the other example FIGS. 2-6.

In the example of FIG. 8, the thickness of the first and second resonator spines 352 and 354 decreases at a region of crossovers with the respective first and second resonator ribs 356 and 358. In the example of FIG. 8, the crossover of the first resonator spine 352 and the second resonator rib 358 is demonstrated at 360, and the crossover of the second resonator spine 354 and the first resonator rib 356 is demonstrated at 362. Beyond the crossovers 360 and 362, the respective resonator spines 352 and 354 increase in thickness, such as back to the thickness at the respective portions prior to the respective crossovers 360 and 362. Similarly, the thickness of the first and second resonator ribs 356 and 358 decreases at the respective crossovers 362 and 360. Beyond the crossovers 362 and 360, the respective resonator ribs 356 and 358 increase in thickness, such as back to the thickness at the respective portions prior to the respective crossovers 362 and 360. In the example of FIG. 8, the crossover 360 is demonstrated as the second resonator rib 358 crossing under the first resonator spine 352, and the crossover 362 is demonstrated as the first resonator rib 356 crossing over the second resonator spine 354. However, it is to be understood that the manner of crossover is arbitrary and provided in the example of FIG. 8 by example.

The reduction in thickness of the resonator spines 352 and 354 and of the resonator ribs 356 and 358 at the crossovers 360 and 362 can thus mitigate a capacitive coupling between the clock signals I_CLK and Q_CLK. For example, the reduced thickness of the resonator spines 352 and 354 and of the resonator ribs 356 and 358 results in a reduced area of the respective resonator spines 352 and 354 and resonator ribs 356 and 358 that crosses over with respect to each other, and thus reduces a capacitance associated with the capacitive coupling between the resonator spines 352 and 354 relative to the resonator ribs 356 and 358. As a result, the reduced capacitance can result in a mitigated capacitive coupling between the clock signals I_CLK and Q_CLK. Accordingly, the reduced thickness portions of the resonator spines 352 and 354 and the resonator ribs 356 and 358 at the respective crossovers 360 and 362 can correspond to the isolation element(s) 24 in the example of FIG. 1.

In addition, the resonator system 350 further includes a first via-wall extension 364 and a second via-wall extension 366. As an example, the first and second via-wall extensions 364 and 366 can extend from a ground plane layer (e.g., the ground plane 306). In the example of FIG. 8, the first via-wall extension 364 extends laterally along a portion of the resonator rib 356, including the crossover 362, and the second via-wall extension 366 extends laterally along a portion of the resonator rib 358, including the crossover 360. The via-wall extensions 364 and 366 can be grounded (e.g., based on extending from the ground plane 306), and can thus provide additional isolation of the respective crossovers 360 and 362. As a result, the isolation provided by the via-wall extensions 364 and 366 can result in a mitigated capacitive coupling between the clock signals I_CLK and Q_CLK. While the via-wall extensions 364 and 366 are demonstrated behind the crossovers 360 and 362, it is to be understood that the via-wall extensions 364 and 366 can instead be arranged in front of the crossovers 360 and 362, or can extend between the resonator spines 352 and 354 and the resonator ribs 356 and 358 at the respective crossovers 360 and 362. Accordingly, the via-wall extensions 364 and 366 can also correspond to the isolation element(s) 24 in the example of FIG. 1.

Figure 9:
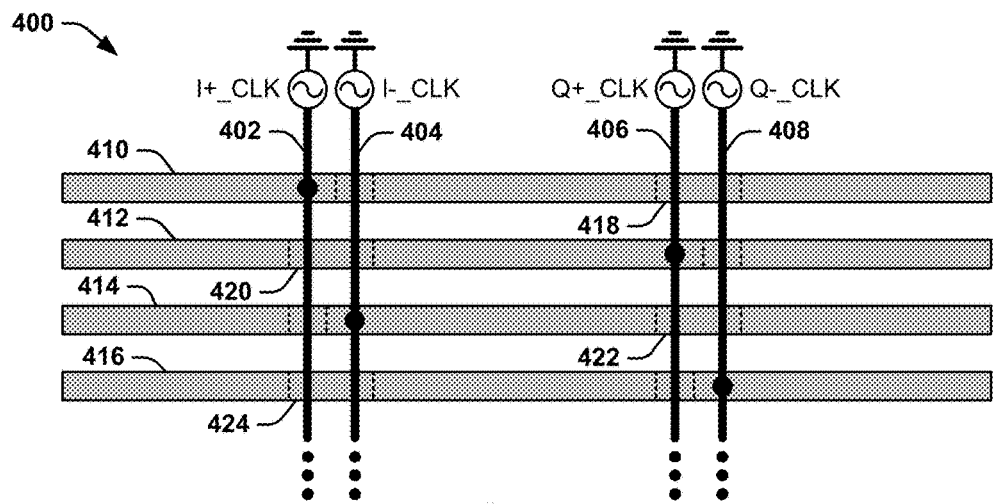
FIG. 9 illustrates another example of a resonator system.

FIG. 9 illustrates an example of a resonator system 400. The resonator system 400 can correspond to one of the resonator system(s) 12 in the example of FIG. 1. Therefore, reference is to be made to the example of FIG. 1 in the following description of the example of FIG. 9.

In the example of FIG. 9, the resonator system 400 includes a first resonator spine 402, a second resonator spine 404, a third resonator spine 406, and a fourth resonator spine 408. In the example of FIG. 9, the first resonator spine 402 propagates a first clock signal, demonstrated in the example of FIG. 9 as a first in-phase clock signal I+_CLK, and the second resonator spine 404 propagates a second clock signal, demonstrated in the example of FIG. 9 as a second in-phase clock signal I−_CLK. The first and second in-phase clock signals I+_CLK and I−_CLK can correspond to opposite polarities of the same clock signal (e.g., the in-phase clock signal I_CLK). Similarly, the third resonator spine 406 propagates a third clock signal, demonstrated in the example of FIG. 9 as a first quadrature-phase clock signal Q+_CLK, and the fourth resonator spine 408 propagates a fourth clock signal, demonstrated in the example of FIG. 9 as a second quadrature-phase clock signal Q−_CLK. The first and second quadrature-phase clock signals Q+_CLK and Q−_CLK can correspond to opposite polarities of the same clock signal (e.g., the quadrature-phase clock signal Q_CLK). As an example, the opposite polarities of the respective clock signals first and second in-phase clock signals I+_CLK and I−_CLK and the respective first and second quadrature-phase clock signals Q+_CLK and Q−_CLK can be based on a 180° phase shift with respect to each other. As another example, the timing operations of the first and second in-phase clock signals I+_CLK and I−_CLK and of the first and second quadrature-phase clock signals Q+_CLK and Q−_CLK can be substantially the same, such as based on alternating inductive coupling polarities of the inductive coupling lines with respect to each other. In the example of FIG. 9, the pair of resonator spines 402 and 404 are arranged proximal to and in parallel with each other, and the pair of resonator spines 406 and 408 are arranged proximal to and in parallel with each other. The resonator system 400 also includes a first resonator rib 410 that is conductively coupled to the first resonator spine 402, a second resonator rib 412 that is conductively coupled to the third resonator spine 406, a third resonator rib 414 that is conductively coupled to the second resonator spine 404, and a fourth resonator rib 416 that is conductively coupled to the fourth resonator spine 408.

To distribute the first and second clock signals I_CLK and Q_CLK, respectively, to various parts of the circuit, such as in an IC chip, the resonator ribs 410, 412, 414, and 416 can extend in both directions orthogonally from the respective resonator spines 402, 404, 406, and 408. As a result, in the example of FIG. 9, the first resonator rib 410 is demonstrated as passing under the third and fourth resonator spines 406 and 408, demonstrated at crossovers 418, and the second resonator rib 412 is demonstrated as passing under the first and second resonator spines 402 and 404, demonstrated at crossovers 420. Similarly, the third resonator rib 414 is demonstrated as passing under the third and fourth resonator spines 406 and 408, demonstrated at crossovers 422, and the fourth resonator rib 416 is demonstrated as passing under the first and second resonator spines 402 and 404, demonstrated at crossovers 424. While the example of FIG. 9 demonstrates that the resonator ribs 410, 412, 414, and 416 pass under (e.g., behind) the respective resonator spines 402, 404, 406, and 408, it is to be understood that one or more of the resonator ribs 410, 412, 414, and 416 can pass over (e.g., in front of) the respective resonator spines 402, 404, 406, and 408.

As described previously in the example of FIG. 6, at each of the crossovers 418, 420, 422, and 424, the clock signals I_CLK and Q_CLK can be capacitively coupled with respect to each other. However, because a given one of the resonator ribs 410 and 414 crosses over both resonator spines 406 and 408, a capacitive coupling contribution provided by the first quadrature-phase clock signal Q+_CLK from the third resonator spine 406 is likewise provided approximately equally and oppositely by the second quadrature-phase clock signal Q−_CLK from the fourth resonator spine 408. Similarly, because a given one of the resonator ribs 412 and 416 crosses over both resonator spines 402 and 404, a capacitive coupling contribution provided by the first in-phase clock signal I+_CLK from the first resonator spine 402 is likewise provided approximately equally and oppositely by the second in-phase clock signal I−_CLK from the second resonator spine 404. Accordingly, the capacitive coupling provided by a given one of the resonator spines 402, 404, 406, and 408 at a given one of the crossovers 418, 420, 422, and 424 is substantially negated (e.g., canceled) by the opposite capacitive coupling provided by the complementary clock signal at the other crossover one of the crossovers 418, 420, 422, and 424 associated with the complementary clock signal. As a result, the complementary capacitive couplings at the respective crossovers can result in a mitigated capacitive coupling between the clock signals I_CLK and Q_CLK. Accordingly, the arrangement of the complementary clock signals with respect to the resonator spines 402, 404, 406, and 408 can correspond to the isolation element(s) 24 in the example of FIG. 1.

In addition, the resonator system 400 can be configured to substantially mitigate inductive coupling between the clock signals I_CLK and Q_CLK. In the example of FIG. 9, the currents provided in the resonator ribs 410 and 414 couple inductively (e.g., via mutual inductance) to the resonator rib 412 in an approximately equal and opposite manner to provide a net inductive coupling to the resonator rib 412 of approximately zero. Similarly, the resonator ribs 412 and 416 couple in an approximately equal and opposite manner to the resonator rib 414. Thus this structure cancels out both inductive and capacitive coupling between the I and Q systems.)

Figure 10:
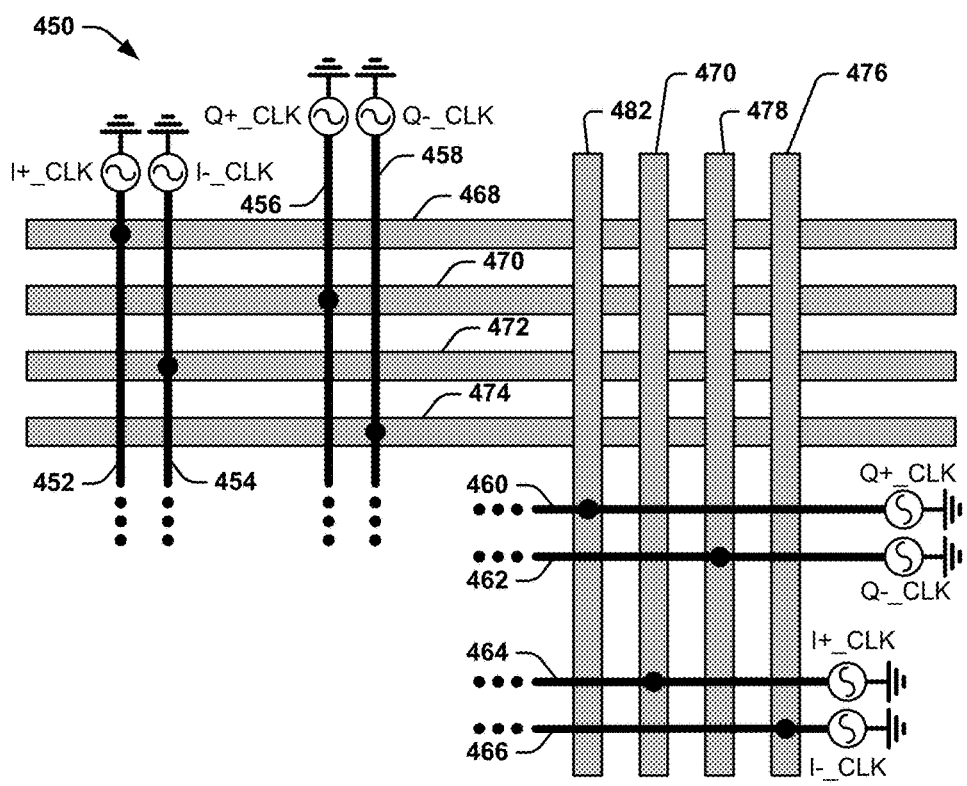
FIG. 10 illustrates another example of a resonator system.

FIG. 10 illustrates an example of a resonator system 450. The resonator system 450 can correspond to one of the resonator system(s) 12 in the example of FIG. 1. Therefore, reference is to be made to the example of FIG. 1 in the following description of the example of FIG. 10.

In the example of FIG. 10, the resonator system 450 includes a first resonator spine 452, a second resonator spine 454, a third resonator spine 456, and a fourth resonator spine 458. In the example of FIG. 10, the first resonator spine 452 propagates a first clock signal, demonstrated in the example of FIG. 10 as the first in-phase clock signal I+_CLK, and the second resonator spine 454 propagates a second clock signal, demonstrated in the example of FIG. 10 as the second in-phase clock signal I−_CLK. Similarly, the third resonator spine 456 propagates a third clock signal, demonstrated in the example of FIG. 10 as the first quadrature-phase clock signal Q+_CLK, and the fourth resonator spine 458 propagates a fourth clock signal, demonstrated in the example of FIG. 10 as the second quadrature-phase clock signal Q−_CLK. Similar to as described previously, the first and second in-phase clock signals I+_CLK and I−_CLK can correspond to opposite polarities of the same clock signal (e.g., the in-phase clock signal I_CLK), and the first and second quadrature-phase clock signals Q+_CLK and Q−_CLK can correspond to opposite polarities of the same clock signal (e.g., the quadrature-phase clock signal Q_CLK).

In addition, the resonator system 450 includes a fifth resonator spine 460, a sixth resonator spine 462, a seventh resonator spine 464, and an eighth resonator spine 466. In the example of FIG. 10, the fifth resonator spine 460 propagates the first in-phase clock signal I+_CLK, and the sixth resonator spine 462 propagates the second in-phase clock signal I−_CLK. Similarly, the seventh resonator spine 464 propagates the first quadrature-phase clock signal Q+_CLK, and the eighth resonator spine 466 propagates the second quadrature-phase clock signal Q−_CLK. In the example of FIG. 10, the resonator spines 460, 462, 464, and 466 are arranged orthogonally with respect to the resonator spines 452, 454, 456, and 458.

In the example of FIG. 10, the respective pairs of resonator spines 452 and 454, 456 and 458, 460 and 462, and 464 and 466 are arranged proximal to and in parallel with each other. The resonator system 450 also includes a first resonator rib 468 that is conductively coupled to the first resonator spine 452, a second resonator rib 470 that is conductively coupled to the third resonator spine 456, a third resonator rib 472 that is conductively coupled to the second resonator spine 454, and a fourth resonator rib 474 that is conductively coupled to the fourth resonator spine 458. Similarly, the resonator system 450 also includes a fifth resonator rib 476 that is conductively coupled to the fifth resonator spine 460, a sixth resonator rib 478 that is conductively coupled to the sixth resonator spine 462, a seventh resonator rib 480 that is conductively coupled to the seventh resonator spine 464, and a fourth resonator rib 482 that is conductively coupled to the eighth resonator spine 484.

Similar to as described previously, to distribute the first and second clock signals I_CLK and Q_CLK, respectively, to various parts of the circuit, such as in an IC chip, the resonator ribs can extend in both directions orthogonally from the respective resonator spines. In the example of FIG. 10, the resonator ribs 468, 470, 472, and 474 are demonstrated as orthogonally crossing over the resonator ribs 476, 478, 482, and 484, similar to the crossing over of the resonator ribs with respect to the resonator spines in the previously described example of FIG. 9. As a result, a capacitive coupling contribution provided by the first in-phase clock signal I+_CLK with respect to the resonator ribs 468, 470, 472, and 474 and the resonator ribs 476, 478, 482, and 484 is likewise provided approximately equally and oppositely by the second in-phase clock signal I−_CLK. Similarly, a capacitive coupling contribution provided by the first quadrature-phase clock signal Q+_CLK with respect to the resonator ribs 468, 470, 472, and 474 and the resonator ribs 476, 478, 482, and 484 is likewise provided approximately equally and oppositely by the second in-phase clock signal Q−_CLK. Accordingly, the capacitive coupling provided by a given one of the resonator ribs 468, 470, 472, and 474 or a given one of the resonator ribs 476, 478, 482, and 484 at a given crossover is substantially negated (e.g., canceled) by the opposite capacitive coupling provided by the complementary clock signal at the other respective crossover associated with the complementary clock signal. As a result, the complementary capacitive couplings at the respective crossovers can result in a mitigated capacitive coupling between the clock signals I_CLK and Q_CLK. Accordingly, the arrangement of the complementary clock signals with respect to the resonator ribs 468, 470, 472, and 474 and the resonator ribs 476, 478, 482, and 484 can correspond to the isolation element(s) 24 in the example of FIG. 1.

Figure 11:
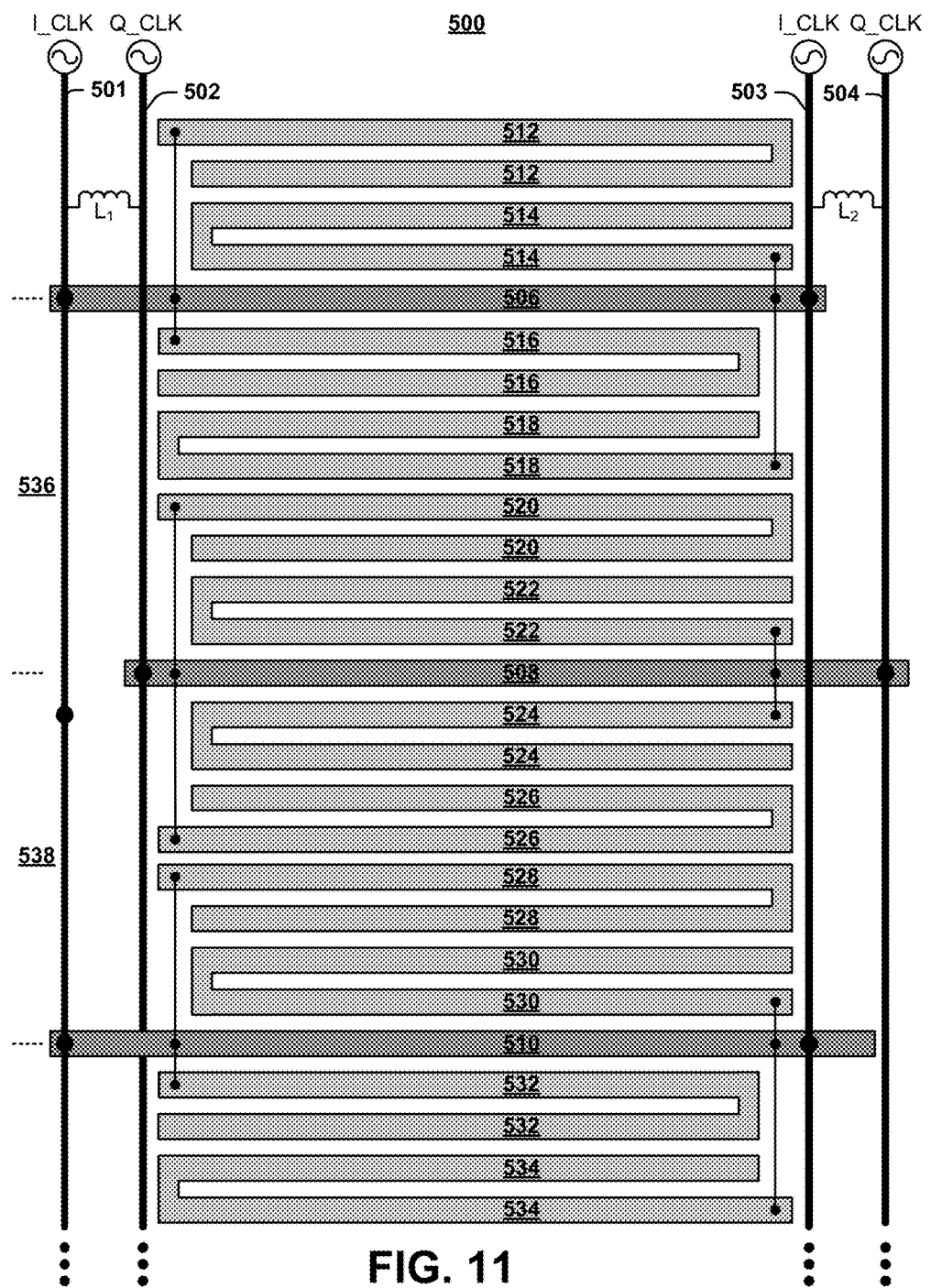
FIG. 11 illustrates another example of a resonator system.

FIG. 11 illustrates an example of a resonator system 500. The resonator system 500 can correspond to one of the resonator system(s) 12 in the example of FIG. 1. Therefore, reference is to be made to the example of FIG. 1 in the following description of the example of FIG. 11.

In the example of FIG. 11, the resonator system 500 includes a first resonator spine 501, a second resonator spine 502, a third resonator spine 503, and a fourth resonator spine 504. In the example of FIG. 11, each of the first and third resonator spines 501 and 503 propagate a first clock signal, demonstrated in the example of FIG. 11 as an in-phase clock signal I_CLK, and each of the second and fourth resonator spines 502 and 504 propagate a second clock signal, demonstrated in the example of FIG. 11 as a quadrature-phase clock signal Q_CLK. The resonator system 500 also includes a plurality of cross-bars. In the example of FIG. 11, the resonator system 500 includes a first cross-bar 506 that is conductively coupled to the first and third resonator spines 501 and 503, a second cross-bar 508 that is conductively coupled to the second and fourth resonator spines 502 and 504, and a third cross-bar 510 that is also conductively coupled to the first and third resonator spines 501 and 503. It is to be understood that the resonator system 500 can include additional cross-bars that alternate conductive coupling between the first and third resonator spines 501 and 503 and between the second and fourth resonator spines 502 and 504.

The resonator system 500 includes resonator ribs that are conductively coupled to the cross-bars 506, 508, and 510, such that the cross-bars interconnect the resonator ribs and the resonator spines 501, 502, 503, and 504. In the example of FIG. 11, the resonator system 500 includes a first pair of resonator ribs 512 and 514 that are conductively coupled to a first side of the first cross-bar 506, and thus propagate the in-phase clock signal I_CLK. The first pair of resonator ribs 512 and 514 are each demonstrated as having bends that spiral in a clockwise manner. The resonator system 500 also includes a second pair of resonator ribs 516 and 518 that are conductively coupled to a second side of the first cross-bar 506, and thus likewise propagate the in-phase clock signal I_CLK. The second pair of resonator ribs 516 and 518 are also each demonstrated as having bends that spiral in a clockwise manner.

In the example of FIG. 11, the resonator system 500 also includes a third pair of resonator ribs 520 and 522 that are conductively coupled to a first side of the second cross-bar 508, and thus propagate the quadrature-phase clock signal Q_CLK. The third pair of resonator ribs 520 and 522 are each demonstrated as having bends that spiral in a clockwise manner. The resonator system 500 also includes a fourth pair of resonator ribs 524 and 526 that are conductively coupled to a second side of the second cross-bar 508, and thus likewise propagate the quadrature-phase clock signal Q_CLK. The fourth pair of resonator ribs 524 and 526 are each demonstrated as having bends that spiral in a counter-clockwise manner.

The resonator system 500 further includes a fifth pair of resonator ribs 528 and 530 that are conductively coupled to a first side of the third cross-bar 510, and thus propagate the in-phase clock signal I_CLK. The fifth pair of resonator ribs 528 and 530 are each demonstrated as having bends that spiral in a clockwise manner. The resonator system 500 also includes a sixth pair of resonator ribs 532 and 534 that are conductively coupled to a second side of the third cross-bar 510, and thus likewise propagate the in-phase clock signal I_CLK. The sixth pair of resonator ribs 532 and 534 are also each demonstrated as having bends that spiral in a clockwise manner.

Thus as demonstrated in the example of FIG. 11, the resonator system 500 is arranged as rows that are defined by the pairs of resonator ribs between the respective cross-bars 506, 508, and 510. The example of FIG. 11 demonstrates a first row 536 between the first and second cross-bars 506 and 508 and a second row 538 between the second and third cross-bars 508 and 510. As demonstrated by the example of FIG. 11, the orientation of the resonator ribs in each of the rows alternates between a same orientation and an alternate orientation with respect to the pairs of resonator ribs coupled to the respective cross-bars.

For example, the first row 536 demonstrates that the second pair of resonator ribs 516 and 518 and the third pair of resonator ribs 520 and 522 have a same orientation with respect to each other, and therefore provide a net negative mutual inductive coupling between the in-phase clock signal I_CLK and the quadrature-phase clock signal Q_CLK. However, the second row 538 demonstrates that the fourth pair of resonator ribs 524 and 526 and the fifth pair of resonator ribs 528 and 530 have an opposite orientation with respect to each other, and therefore provide a net positive mutual inductive coupling between the in-phase clock signal I_CLK and the quadrature-phase clock signal Q_CLK. As a result, contributions to mutual inductive coupling between the first and second rows 536 and 538 can be approximately equal and opposite, thus providing a net mutual inductive coupling between the first and second rows 536 and 538 of approximately zero. Accordingly, by alternating between same orientation and opposite orientation of each sequential row between the cross-bars, the mutual inductance between the in-phase clock signal I_CLK and the quadrature-phase clock signal Q_CLK can be substantially mitigated. It is to be understood that the resonator system 500 can include multiple additional rows between multiple additional cross-bars, similar to as demonstrate in the example of FIG. 11.

Additionally, the cross-bars 506, 508, and 510 can be implemented to substantially reduce the number of crossovers between resonator ribs and the resonator spines 501, 502, 503, and 504. For example, the number of crossovers in the resonator system 500 is reduced to one-third relative to a resonator system in which the resonator ribs were coupled directly to resonator spines 501, 502, 503, and 504. As a result, the capacitive coupling between the in-phase clock signal I_CLK and the quadrature-phase clock signal Q_CLK can also be substantially mitigated. Furthermore, in the example of FIG. 11, the resonator system 500 includes inductors $L_1$ and $L_2$ that interconnect the respective pairs of first and second resonator spines 501 and 502 and third and fourth resonator spines 503 and 504. Accordingly, by implementing an inductance between each of the in-phase clock signal I_CLK and the quadrature-phase clock signal Q_CLK, as provided on the resonator spines 501 and 503 and the resonator spines 502 and 504, respectively, and based on the 90'relative phase of the in-phase clock signal I_CLK and the quadrature-phase clock signal Q_CLK, the capacitive coupling between the in-phase clock signal I_CLK and the quadrature-phase clock signal Q_CLK can be further mitigated by choosing inductance values that cancel the capacitive coupling between the in-phase clock signal I_CLK and the quadrature-phase clock signal Q_CLK at the operating frequency of the resonator system 500. The inductors $L_1$ and $L_2$ can be implemented, for example, as transmission line segments of the appropriate length and impedance. Accordingly, in the example of FIG. 11, the arrangement of the alternating orientation of the rows 536 and 538 of the resonator ribs, the cross-bars 506, 508, and 510, and the inductors $L_1$ and $L_2$ can correspond to the isolation element(s) 24 in the example of FIG. 1.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A clock distribution system comprising:
   a first resonator spine that propagates a first clock signal;
   a second resonator spine that propagates a second clock signal that is out-of-phase relative to the first clock signal;
   at least one resonator rib each conductively coupled to at least one of the first and second resonator spines and being arranged as a standing wave resonator with respect to a respective at least one of the first and second clock signals to inductively provide the respective at least one of the first and second clock signals to an associated circuit via a respective transformer-coupling line; and
   an isolation element configured to mitigate at least one of inductive and capacitive coupling between the first and second clock signals.

2. The system of claim 1, wherein the first clock signal is an in-phase clock signal and the second clock signal is a quadrature phase clock signal.

3. The system of claim 1, wherein the at least one resonator rib comprises a first resonator rib conductively coupled to the first resonator spine and a second resonator rib conductively coupled to the second resonator spine, wherein the isolation element comprises a portion of the first resonator rib and a portion of the second resonator rib arranged proximal and in parallel with each other, wherein the first resonator spine is conductively coupled to the portion of the first resonator rib and the second resonator spine is conductively coupled to the portion of the second resonator rib.

4. The system of claim 3, wherein the isolation element further comprises a grounded cross-bar conductor that extends between and in parallel with each of the portions of the respective first and second resonator ribs.

5. The system of claim 3, wherein the portions of the first and second resonator ribs are asymmetrical along the length of the respective portions of the first and second resonator ribs with respect to the coupling of the first resonator rib to the first resonator spine and with respect to the coupling of the second resonator rib to the second resonator spine.

6. The system of claim 3, wherein the first resonator spine comprises a plurality of first resonator spines that are each coupled to a single first resonator rib, and wherein the second resonator spine comprises a plurality of second resonator spines that are each coupled to a single second resonator rib, wherein the single first resonator rib comprises a plurality of ground connections arranged equidistantly along the first resonator rib from each of the plurality of first resonator spines, and wherein the single second resonator rib comprises a plurality of ground connections arranged equidistantly along the second resonator rib from each of the plurality of second resonator spines.

7. The system of claim 3, wherein the at least one resonator rib comprises a plurality of first resonator ribs and a plurality of second resonator ribs, wherein the system further comprises:
   a plurality of first cross-bars that extend between first and second resonator spines and conductively interconnect the first resonator spine and the first resonator rib; and
   a plurality of second cross-bars that extend between first and second resonator spines and conductively interconnect the second resonator spine and the second resonator rib.

8. The system of claim 7, wherein one of the plurality of first resonator ribs and one of the plurality of second resonator ribs are arranged as one of a plurality of rows between each respective pair of the plurality of first and second cross-bars and between the first and second resonator spines, wherein each of the plurality of first and second resonator ribs comprises a plurality of bends such that each of the plurality of first and second resonator ribs extends in both a parallel and an anti-parallel direction with respect to the respective pluralities of first and second cross-bars in one of a clockwise and a counter-clockwise orientation between the first and second resonator spines, wherein the plurality of rows alternate with respect to same and different orientations with respect to the respective one of the pluralities of first and second resonator ribs.

9. The system of claim 1, wherein each of the first and second resonator spines are coupled to a respective one of the at least one resonator rib, the system further comprising a ground connection coupled to the respective one of the at least one resonator rib approximately equidistant between a conductive coupling of the first and second resonator spines to the respective one of the at least one resonator rib.

10. The system of claim 9, wherein the isolation element comprises a DC cross-bar conductor arranged proximal to and parallel with respective portions of the at least one resonator rib, the DC cross-bar conductor being configured to propagate a DC current.

11. The system of claim 1, wherein the first and second resonator spines are arranged proximal and in parallel with each other, wherein the at least one resonator rib conductively coupled to one of the first and second resonator spines extends from the one of the first and second resonator spines approximately orthogonally and crosses over or under the other of the first and second resonator spines, wherein the isolation element comprises a portion of the at least one resonator rib that crosses over or under the other of the first and second resonator spines.

12. An integrated circuit (IC) chip comprising the clock distribution system of claim 11, wherein the IC chip comprises a clock layer on which the first and second resonator spines are arranged and further comprises a ground plane layer adjacent to the clock layer, wherein the at least one resonator rib conductively coupled to one of the first and second resonator spines extends from the clock layer on one side of the other of the first and second resonator spines, through the ground plane layer, and back through the ground plane layer to the clock layer on an opposite side of the other of the first and second resonator spines.

13. The system of claim 11, further comprising at least one via-wall extending from a ground plane layer and along at least a portion of the at least one resonator rib, wherein the at least a portion of the at least one resonator rib comprises a region of the at least one resonator rib that crosses over or under the other of the first and second resonator spines.

14. The system of claim 11, wherein at least one of the at least one resonator rib and the other of the first and second resonator spines is reduced in thickness at a portion where the at least one resonator rib crosses over or under the other of the first and second resonator spines.

15. The system of claim 11, wherein each of the first and second resonator spines comprises a complementary pair of resonator spines having opposite polarity, wherein the at least one resonator rib conductively coupled to one of the complementary pair of one of the first and second resonator spines extends from the one of the complementary pair of one of the first and second resonator spines approximately orthogonally and crosses over or under the complementary pair of the other of the first and second resonator spines.

16. The system of claim 15, wherein the at least one resonator rib comprises a plurality of resonator ribs, wherein the complementary pair of resonator spines comprises:
   a first complementary pair associated with the first resonator spine and a second complementary pair of the first resonator spine, wherein the first and second complementary pairs associated with the first resonator spine are arranged approximately orthogonally with respect to each other, wherein a first one of the plurality of resonator ribs extends from at least one of the first complementary pair and a second one of the plurality of resonator ribs extends from at least one of the second complementary pair; and
   a first complementary pair associated with the second resonator spine and a second complementary pair of the second resonator spine, wherein the first and second complementary pairs associated with the second resonator spine are arranged approximately orthogonally with respect to each other, wherein a third one of the plurality of resonator ribs extends from at least one of the first complementary pair and a fourth one of the plurality of resonator ribs extends from at least one of the second complementary pair;
   wherein the first and third of the plurality of resonator ribs cross above or below each of the second and fourth of the plurality of resonator ribs.

17. The system of claim 1, wherein the first and second resonator spines are arranged proximal and in parallel with each other, wherein the isolation element comprises an inductor interconnecting the first and second resonator spines to substantially mitigate a capacitive coupling between the first clock signal and the second clock signal.

18. A clock distribution system comprising:
   a first resonator spine that propagates an in-phase clock signal;
   a second resonator spine that propagates a quadrature clock signal;
   a first resonator rib conductively coupled to the first resonator spine and being arranged as a standing wave resonator with respect to the in-phase clock signal to inductively provide the in-phase clock signal to an associated circuit via a first transformer-coupling line, the first resonator rib comprising a portion that is conductively coupled to the first resonator spine;
   a second resonator rib conductively coupled to the second resonator spine and being arranged as a standing wave resonator with respect to the quadrature phase clock signal to inductively provide the quadrature-phase clock signal to an associated circuit via a second transformer-coupling line, the second resonator rib comprising a portion that is conductively coupled to the second resonator spine, wherein the portion of the first resonator rib is arranged proximal and in parallel with the second resonator rib to mitigate at least one of inductive and capacitive coupling between the in-phase and quadrature phase clock signals.

19. The system of claim 18, further comprising a grounded cross-bar conductor that extends between and in parallel with each of the portions of the respective first and second resonator ribs.

20. The system of claim 18, wherein the portions of the first and second resonator ribs are asymmetrical along the length of the respective portions of the first and second resonator ribs with respect to the coupling of the first resonator rib to the first resonator spine and with respect to the coupling of the second resonator rib to the second resonator spine.

21. The system of claim 18, wherein the at least one resonator rib comprises a plurality of first resonator ribs and a plurality of second resonator ribs, wherein the system further comprises:
   a plurality of first cross-bars that extend between first and second resonator spines and conductively interconnect the first resonator spine and the first resonator rib; and
   a plurality of second cross-bars that extend between first and second resonator spines and conductively interconnect the second resonator spine and the second resonator rib.

22. The system of claim 21, wherein one of the plurality of first resonator ribs and one of the plurality of second resonator ribs are arranged as one of a plurality of rows between each respective pair of the plurality of first and second cross-bars and between the first and second resonator spines, wherein each of the plurality of first and second resonator ribs comprises a plurality of bends such that each of the plurality of first and second resonator ribs extends in both a parallel and an anti-parallel direction with respect to the respective pluralities of first and second cross-bars in one of a clockwise and a counter-clockwise orientation between the first and second resonator spines, wherein the plurality of rows alternate with respect to same and different orientations with respect to the respective one of the pluralities of first and second resonator ribs.

23. A clock distribution system comprising:
   a first resonator spine that propagates an in-phase clock signal;
   a second resonator spine that propagates a quadrature clock signal;

at least one resonator rib each conductively coupled to at least one of the first and second resonator spines and being arranged as a standing wave resonator with respect to a respective at least one of the first and second clock signals to inductively provide the respective at least one of the first and second clock signals to an associated circuit via a respective transformer-coupling line, the first and second resonator spines being arranged proximal and in parallel with each other, wherein the at least one resonator rib conductively coupled to one of the first and second resonator spines extends from the one of the first and second resonator spines approximately orthogonally and crosses over or under the other of the first and second resonator spines.

24. An integrated circuit (IC) chip comprising the clock distribution system of claim 23, wherein the IC chip comprises a clock layer on which the first and second resonator spines are arranged and further comprises a ground plane layer adjacent to the clock layer, wherein the at least one resonator rib conductively coupled to one of the first and second resonator spines extends from the clock layer on one side of the other of the first and second resonator spines, through the ground plane layer, and back through the ground plane layer to the clock layer on an opposite side of the other of the first and second resonator spines.

25. The system of claim 23, further comprising at least one via-wall extending from a ground plane layer and along at least a portion of the at least one resonator rib, wherein the at least a portion of the at least one resonator rib comprises a region of the at least one resonator rib that crosses over or under the other of the first and second resonator spines.

26. The system of claim 23, wherein at least one of the at least one resonator rib and the other of the first and second resonator spines is reduced in thickness at a portion where the at least one resonator rib crosses over or under the other of the first and second resonator spines.

27. The system of claim 23, wherein each of the first and second resonator spines comprises a complementary pair of resonator spines having opposite polarity, wherein the at least one resonator rib conductively coupled to one of the complementary pair of one of the first and second resonator spines extends from the one of the complementary pair of one of the first and second resonator spines approximately orthogonally and crosses over or under the complementary pair of the other of the first and second resonator spines.

* * * * *